US009391060B2

(12) United States Patent
Hellings et al.

(10) Patent No.: US 9,391,060 B2
(45) Date of Patent: Jul. 12, 2016

(54) ELECTROSTATIC DISCHARGE PROTECTION

(71) Applicant: IMEC vzw, Leuven (BE)

(72) Inventors: Geert Hellings, Leuven (BE); Dimitri Linten, Boortmeerbeek (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/581,008

(22) Filed: Dec. 23, 2014

(65) Prior Publication Data

US 2015/0214212 A1     Jul. 30, 2015

(30) Foreign Application Priority Data

Dec. 30, 2013  (EP) ..................................... 13199855

(51) Int. Cl.
  *H01L 27/02*     (2006.01)
  *H01L 29/66*     (2006.01)
  *H01L 29/78*     (2006.01)
  *H01L 27/088*    (2006.01)
  *H01L 29/06*     (2006.01)

(52) U.S. Cl.
  CPC ........ *H01L 27/0255* (2013.01); *H01L 27/0248* (2013.01); *H01L 27/0886* (2013.01); *H01L 29/0649* (2013.01); *H01L 29/66795* (2013.01); *H01L 29/7851* (2013.01)

(58) Field of Classification Search
  CPC ..................... H01L 27/0629; H01L 21/76224
  USPC ................................................ 257/355, 356
  See application file for complete search history.

(56) References Cited

U.S. PATENT DOCUMENTS

| 6,316,813 | B1 | 11/2001 | Ohmi et al. | |
|---|---|---|---|---|
| 7,141,484 | B2 | 11/2006 | Ker et al. | |
| 7,173,310 | B2 | 2/2007 | Voldman et al. | |
| 7,700,449 | B2 | 4/2010 | Lee | |
| 2005/0282342 | A1 | 12/2005 | Adan | |
| 2012/0306005 | A1 | 12/2012 | Satoh et al. | |
| 2013/0264677 | A1 | 10/2013 | Galy et al. | |
| 2013/0292745 | A1* | 11/2013 | Liu et al. | 257/288 |
| 2014/0097465 | A1* | 4/2014 | Shrivastava et al. | 257/133 |
| 2014/0131765 | A1* | 5/2014 | Tsai et al. | 257/133 |
| 2015/0014809 | A1* | 1/2015 | Wang et al. | 257/506 |

OTHER PUBLICATIONS

Extended European Search Report dated May 15, 2014 in Application No. EP 13199855.1.

* cited by examiner

*Primary Examiner* — Cuong Q Nguyen
*Assistant Examiner* — Tong-Ho Kim
(74) *Attorney, Agent, or Firm* — Knobbe, Martens, Olson & Bear LLP

(57) ABSTRACT

An electrostatic discharge (ESD) protection device implemented in finFET technology is disclosed. The device has a reduced thickness shallow trench isolation (STI) layer which allows migration of high-doped drain implants therethrough to form regions extending under the STI layer thereby creating a planar-like region under the STI layer. Further, the regions are formed in an n-well layer provided between a substrate and the STI layer. The formation of the planar-like region under the STI layer has the advantage that part of the thermal energy produced in the device during an ESD event is generated under the STI layer where it can be more efficiently dissipated towards a substrate.

16 Claims, 6 Drawing Sheets

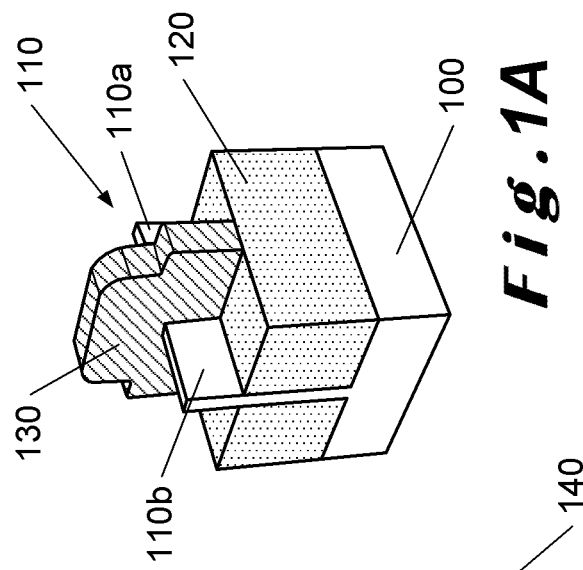
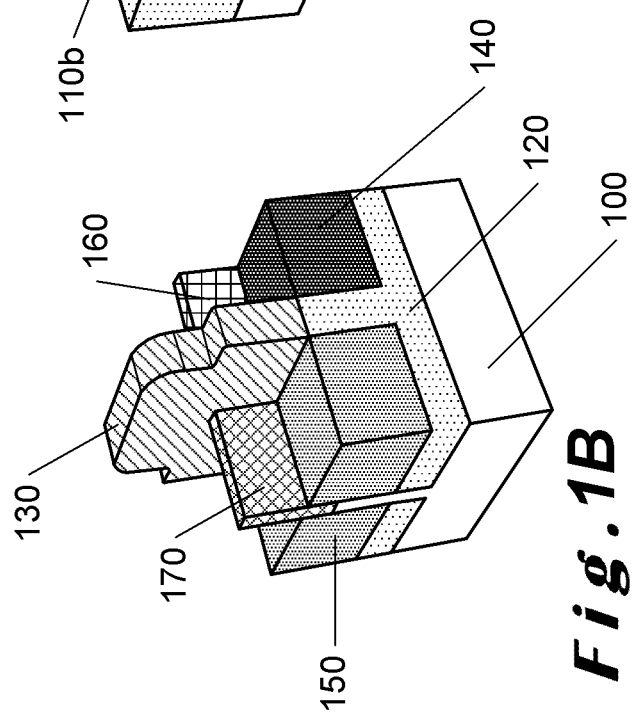

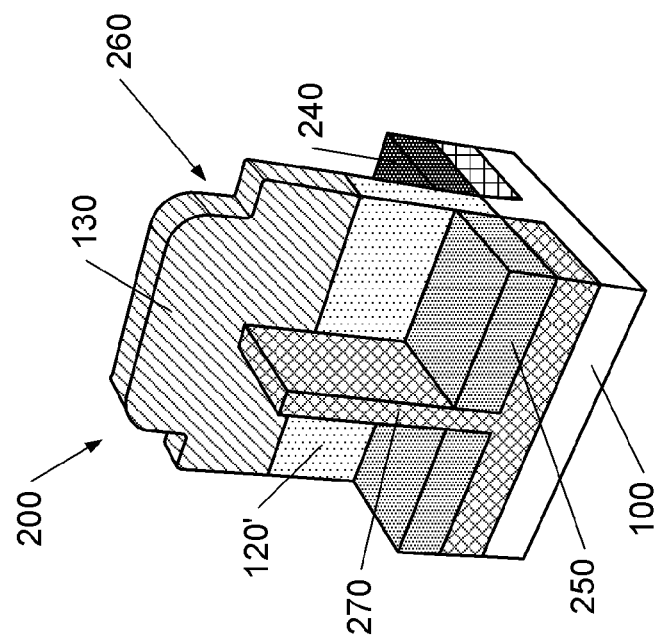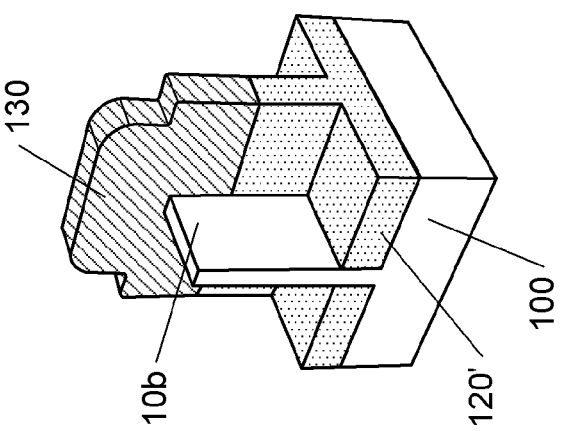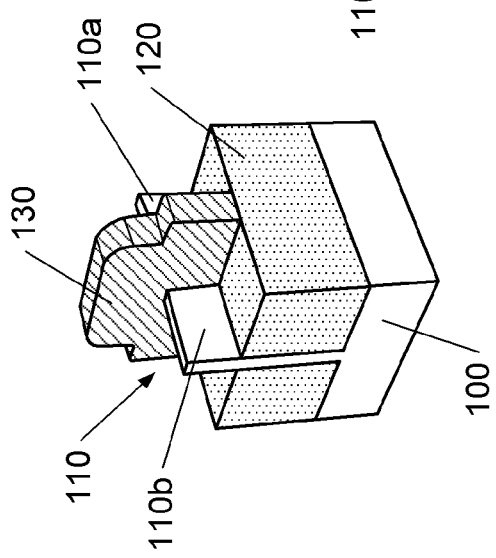

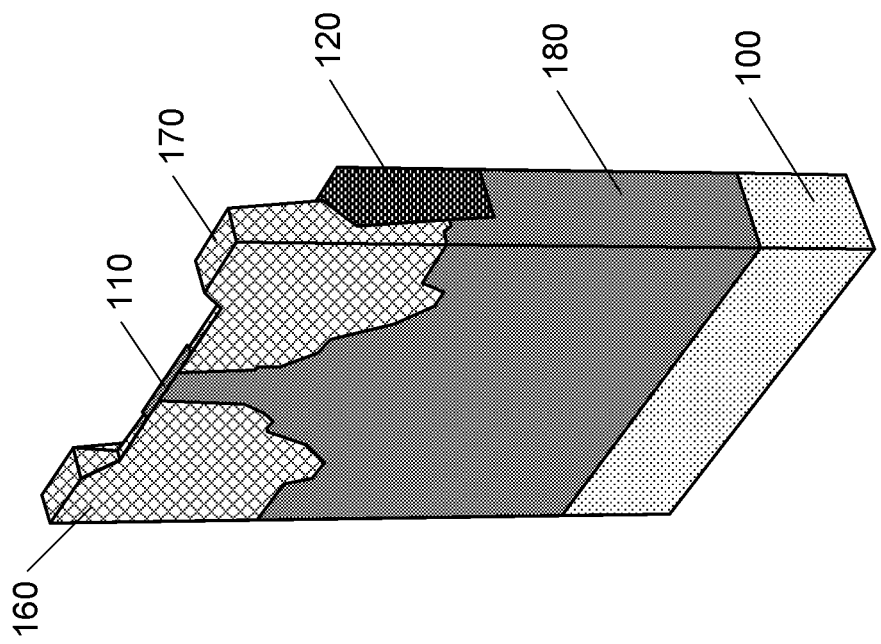
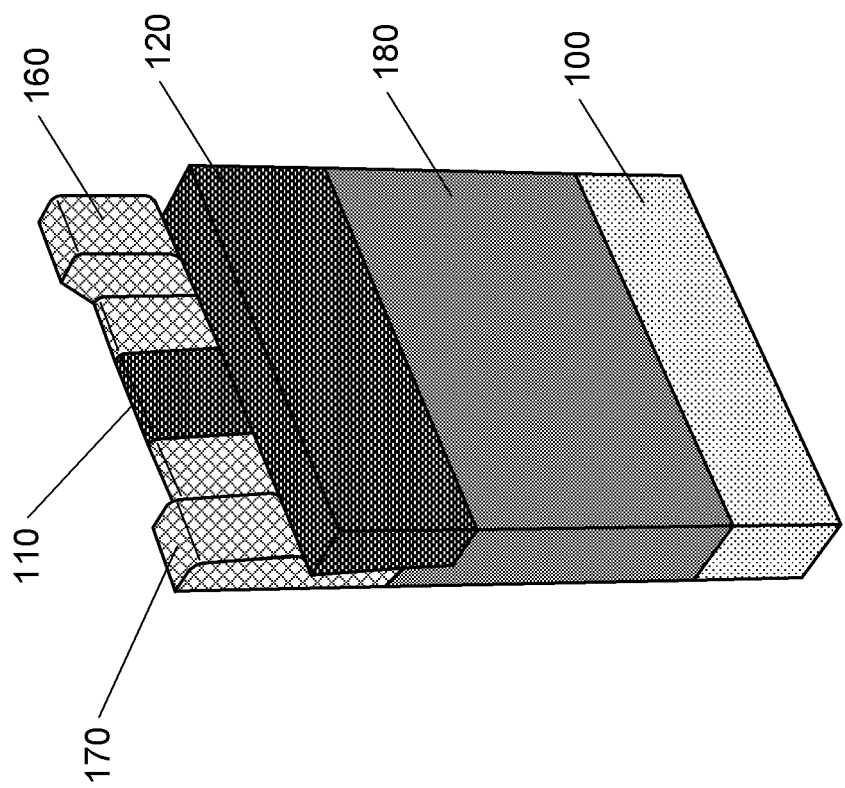
Fig. 4
Fig. 3

ELECTROSTATIC DISCHARGE PROTECTION

BACKGROUND

1. Technological Field

The present disclosure relates to improvements in or relating to electrostatic discharge protection, and is more particularly concerned with providing such protection in fin-based field effect transistor technology.

2. Description of the Related Technology

Electrostatic discharge (ESD) protection in fin-based FET (finFET) technology is known to result in more area consumption than in a planar technology because the shallow trench isolation (STI) oxide in between the fins is essentially not used. This increase in required area for ESD protection results in an increased manufacturing cost for integrated circuits (ICs) using finFET technologies.

U.S. Pat. No. 7,141,484 discloses a method of forming an ESD device which includes forming a first and a second semiconductor fin over a substrate and adjacent to one other, epitaxially growing a semiconductor material on the first and the second semiconductor fins so that a first portion of the semiconductor material grown from the first semiconductor fin joins a second portion of the semiconductor material grown from the second semiconductor fin, and implanting different semiconductor materials at a first end portion and a second end portion of the semiconductor material on the first and the second semiconductor fins to form respective first and second implant regions. A p-n junction is formed between the first end and the second end of the semiconductor material, the p-n junction forming a junction of an ESD diode, or a junction in an npn or a pnp bipolar junction transistor (BJT).

However, in ESD protection, it is necessary that any thermal energy generated in the device is quickly dissipated so that the functionality of the ESD device is not reduced due to any build up of thermal energy. In the device disclosed in U.S. Pat. No. 7,700,449, there is no direct path to allow the dissipation of thermal energy generated when an ESD occurs.

SUMMARY OF CERTAIN INVENTIVE ASPECTS

It is therefore an object of the present disclosure to provide improved thermal energy dissipation for ESD devices implemented using bulk finFET technology.

It is another object of the present disclosure to minimize the manufacturing cost by minimizing the area required to implement ESD devices using bulk finFET technology.

In accordance with the present disclosure, there is provided a bulk fin-based electrostatic discharge device comprising: a semiconductor substrate; an isolating layer, over the semiconductor substrate, comprising a first recess defining a first region and a second region; and a first fin protruding from the semiconductor substrate through the first recess in the isolating layer within the first and second regions, one part of the first fin and an upper substrate portion in the first region being homogeneously doped with a first dopant, and another part of the first fin and an upper substrate portion in the second region being homogeneously doped with a second dopant.

By doping the upper substrate portions, a thermal dissipation path is provided for heat generated in the fin. This provides a more robust device for dissipating thermal energy generated by a high current in the event of an electrostatic discharge event.

In addition, a single extra step is provided in standard applied HDD manufacturing processes to form each recess in the isolating layer so that the upper portions of the semiconductor substrate can provide the thermal dissipation path.

In one embodiment, the substrate further comprises a well, the upper substrate portions in the first and second regions being in an upper part of the well. The well and the semiconductor substrate may be differently doped. In some embodiments, the semiconductor substrate may comprise a p-type material and the well may comprise an n-well. In another embodiment, the semiconductor substrate may comprise an n-type material and the well may comprise a p-well.

In one implementation, the upper substrate portions of the first and second regions extend horizontally under the isolating layer to form a planar-like region thereunder. In certain embodiments, the planar-like region extends under the first fin.

The first dopant may be of opposite type to the second dopant. Alternatively, the first dopant is of a similar type to the second dopant.

The device may also comprise a gate electrode element formed over the first fin, the gate electrode separating the first region and the second region. The gate electrode element may comprise a grounded electrode, which may be an NMOS or PMOS grounded gate electrode.

In another embodiment, the first dopant is substantially the same type as the second dopant and both parts of the first fin are homogeneously doped with substantially the same dopant, the device further comprising a second recess in the isolating layer, and a second fin protruding from the semiconductor substrate through the second recess, upper portions of the second recess and the second fin being oppositely doped to the first fin and the upper substrate portions in the first recess.

The device may further comprise a third region separating the first and second recesses, the third region being substantially undoped.

In one embodiment, a third fin may protrude through the isolating layer in the third region, the third fin being substantially undoped and separating the first recess and the first fin from the second recess and the second fin.

In some embodiments, the first fin and the second fin may be connected to form a diode.

BRIEF DESCRIPTION OF THE DRAWINGS

For a better understanding of the present invention, reference will now be made, by way of example, to the accompanying drawings in which:

FIGS. 1A and 1B illustrate manufacturing steps for standard highly doped drain (HDD) finFET devices;

FIGS. 2A, 2B, and 2C illustrate manufacturing steps for a HDD finFET device in accordance with the present disclosure;

FIG. 3 illustrates a partially sectioned perspective view, from a first side, of a standard finFET device used for ESD protection;

FIG. 4 illustrates a partially sectioned perspective view, from a second side, of a standard finFET device used for ESD protection;

DETAILED DESCRIPTION OF CERTAIN ILLUSTRATIVE EMBODIMENTS

Figure 6:
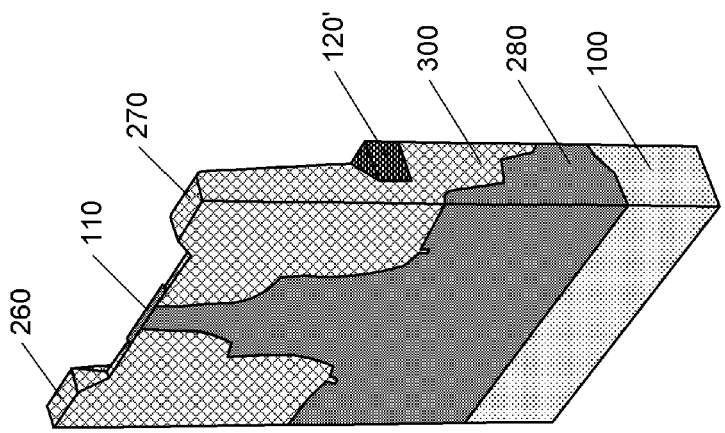
FIGS. 5 and 6 are similar to FIGS. 3 and 4, respectively, but illustrate a finFET device in accordance with the present disclosure in which a thermal dissipation path is provided.

The present disclosure will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

The same reference numerals are used herein to refer to the same component.

The term "doped" as used herein refers to a material that includes a dopant of a particular type, for example, n- or p-type, and/or having a dopant concentration which effectively changes the properties of the material as will readily be understood by a person skilled in the art.

The terms "undoped" or "substantially undoped" as used herein refer to a material which has a dopant concentration which is more than 100 times less than the dopant concentration of a doped material.

The term "differently doped" as used herein refers to materials that have different dopants, for example, n and p dopants, $n^-$ and $n^+$, and $p^-$ and $p^+$, as well as to materials doped with the same dopants but in different concentrations.

The term "opposite type" or "oppositely doped" as used herein refer to a dopant of one type, for example, n-type, which is of opposite type to a dopant of another type, for example, p-type, and also includes either $n^-$ or $n^+$ of one type, and either $p^-$ or $p^+$ of the other type, or vice versa.

The term "similar type" as used herein refers to dopants of one type, for example, n-type, but having different dopant concentrations.

Referring initially to FIGS. 1A and 1B, a process for manufacturing a standard HDD finFET device is shown. The first step comprises providing a substrate 100 which comprises, for example, a p-type material, the substrate extending upwards to form a fin 110 as shown in FIG. 1A. The fin 110 typically has a predetermined height above a surface of the substrate. Typically, an n-well (not shown) is provided over the substrate 100. An STI or isolating layer 120 is formed on the substrate 100 (or n-well) as shown, and has a thickness that is less than the predetermined height of the fin 110. It will readily be appreciated that the value of the predetermined height of the fin is determined in accordance with the particular application.

A gate electrode 130 is formed over the fin 110 with one part 110a of the fin 110 forming one part of the device and another part 110b of the fin 110 forming another part of the device with a third part (not shown) underneath the gate electrode 130. At this stage, the fin 110 is undoped within the STI layer 120.

The HDD implantation steps result in selectively implanted regions or volumes 140, 150 and 160, 170 within the STI layer 120 and the fin 110 respectively. Different materials may be used to alter the doping concentrations of the implanted regions 140, 150, 160, 170 thereby locally changing the characteristics of the STI or isolating layer 120 and the fin 110 in those regions.

As shown in FIG. 1B, the implanted regions 140, 160 are formed on one side, and, the implanted regions 150, 170 are formed on the other side, of the gate electrode 130.

In one embodiment, implanted n+ dopant causes fin part 110a to form a drain 160 and implanted p+ dopant which causes fin part 110b to form a source 170 respectively of the final HDD device as shown in FIG. 1B.

It will be understood that in normal FET devices, the source and drain have similar dopants, but in order to make a gated diode from a FET-like structure, the dopants are of opposite types. Dopant types n+ and p+ are different from cathodes (normally termed n+) and anodes (normally termed p+) in diodes.

In addition, the implanted regions 140, 150 may instead comprise p+ and n+ materials respectively so that the drain and source are formed on opposite sides of the gate electrode 130 to that shown in FIG. 1B. Typically, p+ dopants may comprise phosphorus and arsenic, and, n+ dopants, boron and gallium. However, the choice of dopants are not limited to these particular materials or elements.

It will readily be appreciated that, although the implanted regions 140, 150 are shown as separate regions on top of the STI or isolating layer 120, they are, in reality implanted into the STI isolating layer 120 as will be understood by a skilled person in the field. In FIG. 1B, the implanted regions 140, 150 are shown separately for clarity.

The STI layer 120 has a thickness of between 30 nm and 90 nm, typically 60 nm, which effectively blocks the migration of dopants below the STI layer 120 and effectively forms a thermal barrier to thermally isolate the implanted regions 140, 150 from the substrate 100 and/or n-well if present (not shown). This is due to the lower thermal conductivity of typical STI material, for example, silicon oxide, when compared to silicon alone.

As a result, there is no efficient thermal path to dissipate thermal energy generated in the fin 110 due to an ESD event. This means that the finFET device can be considered to be fragile in terms of thermal durability as in the thermal energy generated by the high current resulting from an ESD event tends to cause melting of the device as much of the thermal energy is retained in the fin itself.

In comparison, FIGS. 2A, 2B, and 2C illustrate the process steps for manufacturing a HDD finFET device 200 (FIG. 2C) in accordance with the present disclosure. FIG. 2A is identical to FIG. 1A and will not be described again here. The next step in the process is to etch the STI or isolating layer 120 in the parts thereof which are not covered by the gate electrode 130 as shown in FIG. 2B. This has the effect of substantially reducing the thickness of the STI or isolating layer 120' locally in the parts thereof which are not covered by the gate electrode 130. These parts having their thickness substantially reduced effectively form recesses in the STI layer or isolating layer. A suitable mask (not shown) is used to shield other components or elements being manufactured in the same process so that they are not etched away with the etching of the STI or isolating layer 120' to reduce its overall thickness.

In this particular embodiment, the gate electrode 130 also acts as a mask to shield the region thereunder so that it is not etched or implanted during the manufacturing process. It will however be appreciated that the presence of the gate electrode 130 is not essential for the etching and implantation steps and that the mask is adapted to shield the region which would be underneath the gate electrode 130 if present.

The implantation step is then carried out as shown in FIG. 2C on the reduced thickness STI or isolating layer 120' in the recesses formed by the etching process to form implanted regions 240, 250 in the STI or isolating layer 120' and implanted regions 260, 270 of the fin. The implantation into the recesses formed in the STI or isolating layer 120' produces an upper substrate portion (not shown) and one part of the fin 260 in a first region 240 which has been homogenously doped with a first dopant, and an upper substrate portion (also not shown) and a part of the fin 270 in a second region 250 which has been homogeneously doped with a second dopant.

As described above with reference to FIG. 1B, implanted region 240 comprises an n+ material forming a drain, and, implanted region 250 comprises a p+ material forming a source, of the device. As before, the implanted regions may instead comprise p+ and n+ materials respectively so that the drain and source are formed on opposite sides of the gate electrode 130 of the final HDD device 200 to that shown in FIG. 2C.

Figure 5:
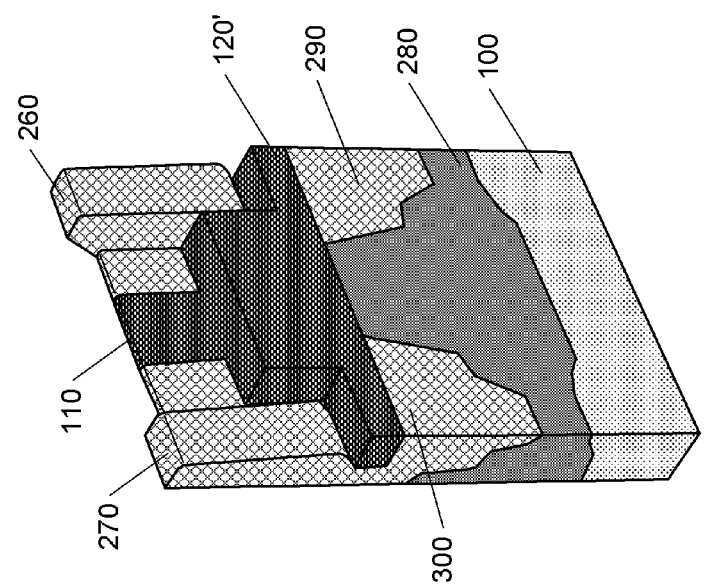

In FIG. 2C, the etched STI layer 120' is sufficiently thin, for example, having a thickness of less than 20 nm, so that there is not sufficient blocking of the implantation of the n+ and p+ materials as described above and the dopants being implanted can form respective HDD regions which extend below the STI or isolating layer 120' to form a planar-like implantation region below the reduced thickness STI or isolating layer 120' as shown in FIG. 5. In one embodiment, this planar-like region also extends horizontally underneath the fin itself (not shown).

In addition, part of the current flows below the STI or isolating layer through the downwardly-extended HDD regions. This results in a lower voltage over the ESD diode during an ESD event. This lower voltage, in turn, results in the generation of less thermal energy within the device. Moreover, part of the thermal energy generated due to an ESD event is generated near the HDD regions extending below the STI or isolating layer, and, this thermal energy or heat can more efficiently be removed from the device towards the substrate.

It will readily be appreciated that the choice of dopant used for implantation is dependent on the operation of the particular HDD device. In addition, in some finFET HDD devices, the material which is implanted may provide two similarly doped regions on either sides of the gate electrode if present.

By etching the STI or isolating layer 120 in specific areas of the chip (hereafter named planar ESD-area), combined finFET and planar-like structures can be manufactured in a finFET technology by the addition of a single lithography step (single mask) and a single etch step. This creates combined finFET and "planar-like" ESD protection structures, which are known to have better characteristics, for example, reduced area and exhibit more uniform behavior, in many applications, with respect to uniform current conduction.

The present disclosure provides an additional step, the etching step, which does not change the standard applied HDD implantation process and is therefore minimally disruptive to the manufacturing flow.

The method of the present disclosure can be used for various devices, for example, gated finFET (FF) diodes, STI FF diodes, grounded-gate nMOS (GGNMOS) devices, grounded-gate pMOS (GGPMOS) devices, MOS clamps, BJT etc.

Although the method of the present disclosure has been described with reference to the HDD implantation step, it will be appreciated that additional more complicated processing steps may follow the steps described above with reference to FIGS. 2A, 2B, and 2C, for example, an epitaxial growth step in the source and/or drain areas followed by an ion implantation step (not shown).

In addition, special implantation steps may be provided for ESD purposes, for example, a "deep n+" and a "deep p+" implant may be used to ensure that HDD is formed below the level of the STI or isolating layer 120'.

FIGS. 3 and 4 illustrate respective partially sectioned perspective views of an ESD device manufactured using finFET technology using a HDD implant process as described above with reference to FIG. 1. FIG. 3 shows a view from one side and FIG. 4 shows a view from another side.

As shown, a substrate 100, typically comprising a p− or n− material, is provided on which an n-well 180 is formed. It will be appreciated that the n-well may comprise a part of the upper substrate portion in the first and second recesses as described above. An STI or isolating layer 120 is formed over the n-well 180 with the fin 110 extending upwards through the STI or isolating layer 120 as is more clearly shown in FIG. 4.

It will readily be appreciated that the actual doping concentrations within the n-well 180 may be graduated due to the manufacturing process and the different levels are not shown for clarity. The substrate 100 may have a doping concentration of between around 5e13 cm$^{-3}$ and around 2e16 cm$^{-3}$, with a possible doping concentration of around 4e15 cm$^{-3}$ (where "e13", "e16" and "e15" respectively refer to concentrations of $10^{13}$, $10^{16}$ and $10^{15}$ as is well understood in the semiconductor field). The n-well 160 may have a doping concentration of between around 2e16 cm$^{-3}$ and around 7e18 cm$^{-3}$.

As shown more clearly in FIG. 4, the implanted regions 160, 170 extend downwardly slightly into the level of the STI or isolating layer 120, but substantially remain within the fin 110 and do not extend downwardly beneath or below the STI or isolating layer 120.

FIGS. 5 and 6 are similar to respective ones of FIGS. 3 and 4 with a substrate 100, typically comprising a p− or n− material, is provided on which an n-well 280 is formed. It will be appreciated that the n-well 280 may comprise a part of the upper substrate portion in the first and second recesses as described above. An STI or isolating layer 120' is formed over the n-well 280 with the fin 110 extending upwards through the STI or isolating layer 120' as is shown more clearly in FIG. 6. In this case, as the thickness of the STI or isolating layer 120' is substantially reduced by etching, to form recesses, prior to the implantation step as described above with reference to FIGS. 2A, 2B, and 2C, the implanted regions 260, 270 extend below the STI or isolating layer 120' into zones 290, 300 as shown in FIGS. 5 and 6 (only zone 300 being visible in FIG. 6).

As mentioned above, the creation of zones 290, 300 underneath the STI or isolating layer 120' results in an extension of the implanted regions 260, 270. As a result, the operation of the ESD protection device is not affected by the ESD and can continue to operate once the ESD has been removed as no permanent damage has been done to the device. This is due to lower voltage over the device and part of the heat generated is below the STI layer where heat can readily be removed from the device as described above.

The HDD device described above is a gated diode where the gate electrode is used to mask implants. In an alternative embodiment, the present disclosure can be applied to an STI diode where one fin is p-doped, the next fin is n-doped, and the next fin to that is p-doped, etc. as described below with reference to FIGS. 7 and 8.

Figure 7:
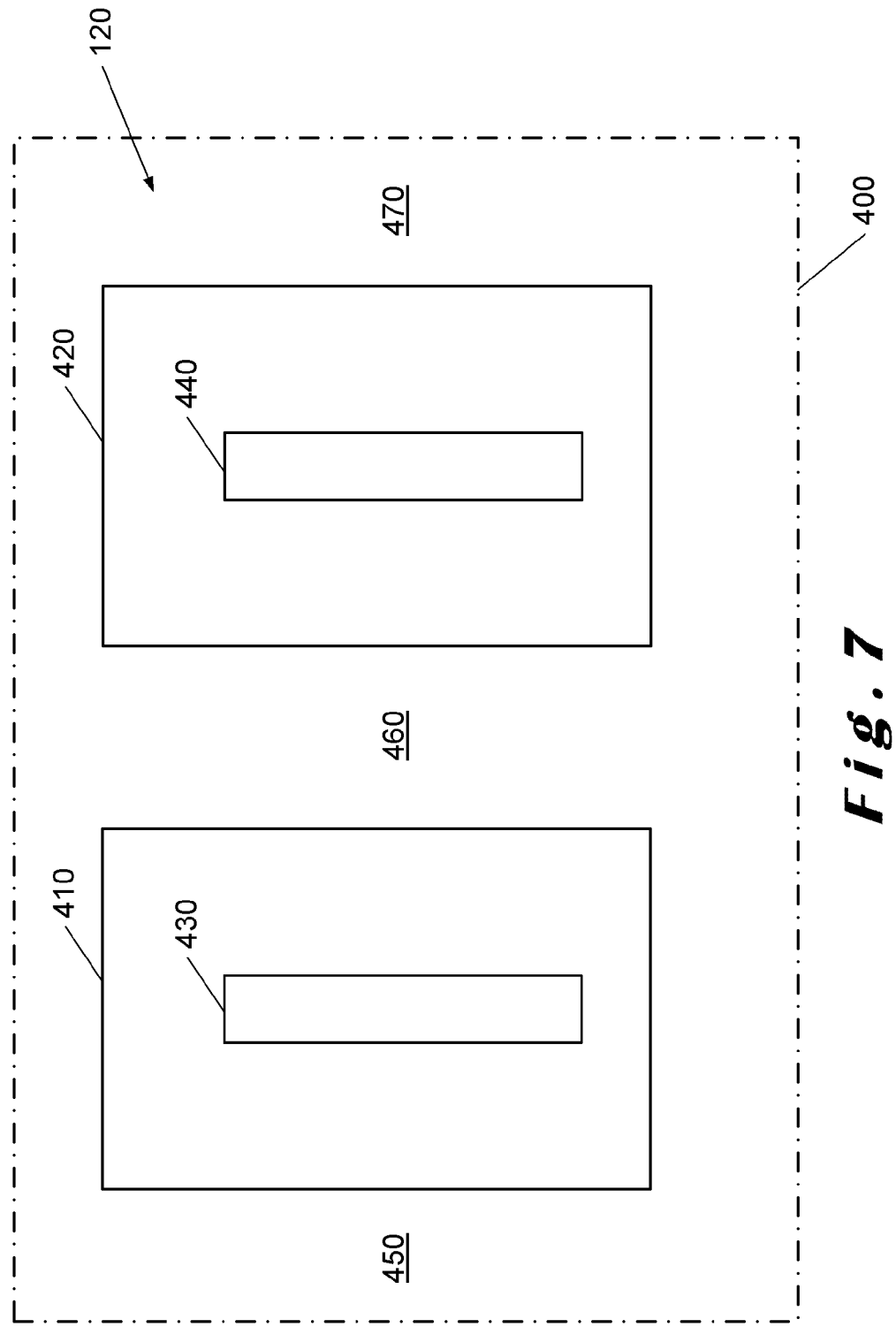
FIG. 7 illustrates a top view of a device comprising two fins in accordance with the present disclosure.

Turning now to FIG. 7, a top view of a device 400 is shown which comprises an STI or isolating layer 120 in which two implanted regions 410, 420 are provided in recesses (not shown) formed by etching of the STI or isolating layer 120. A first fin 430 is shown protruding through a first region 410 and a second fin 440 is shown protruding through a second region 420. In this embodiment, the first region 410 is oppositely doped with respect to the second region 420, and the regions 410, 420 are separated and isolated by portions 450, 460, 470 of the STI or isolating layer 120.

Figure 8:
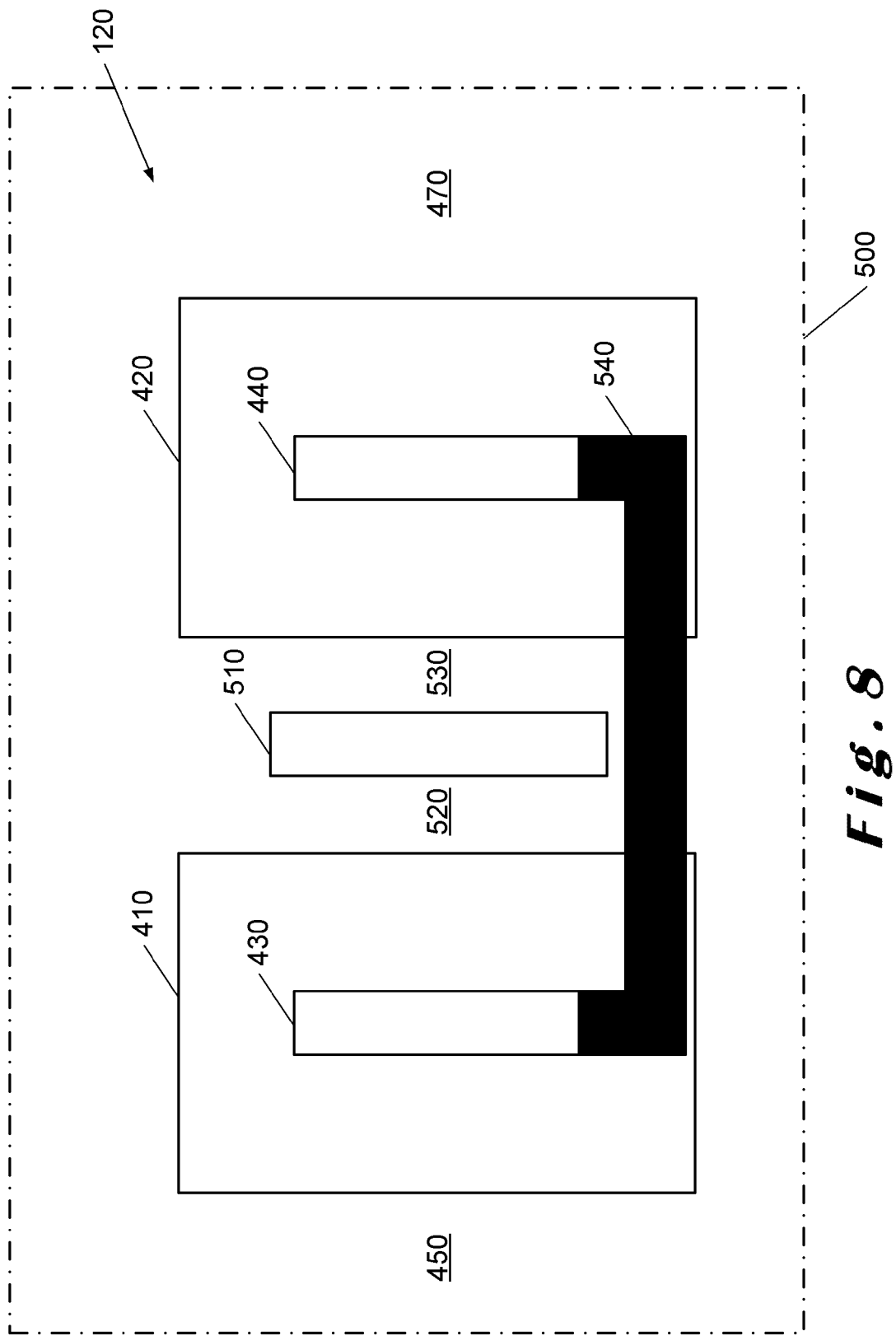
FIG. 8 is similar to FIG. 7, but includes a third fin between the two fins in accordance with the present disclosure.

In FIG. 8, a top view of a device 500 is shown which is similar to the device 400 shown in FIG. 7. In effect, three fins 430, 440, 510 are formed in the same substrate with no gate electrode on any of these fins. The STI or isolating layer 120 is etched away in a first and second region (410, 420) as described above, but now there are four STI regions or zones 450, 470 as shown in FIG. 7 and zone 460 has been divided into two further zones 520, 530 by the fin 510 (one on each side of the three fins) that are etched away to provide thin STI regions or zones around all fins as shown. The etched STI region or zone 410, on the left-hand side of the device 500, together with the fin 430, are n+ doped with an n+ HDD mask and n+ HDD implant. The other etched STI zone 420 on the right-hand side of the device 500, together with the fin 440, are p+ doped with a p+ HDD mask and p+ HDD implant. The middle fin 510 is not HDD doped to ensure isolation between the n+ doped regions and p+ doped regions that extend below the STI regions. The fin 510 is undoped, and thus part of the substrate or well if present. Such a final structure may comprise "(n+ region 410)/(n+ fin 430)/(n+ region 410)/(undoped substrate or well with protruding fin 510 above STI)/(p+ region 420)/(p+ fin 440)/(p+ region 420)" wherein the n+ and p+ are HDD doped in a etched STI zone or recess and extend below the STI or isolating layer 120 into the substrate or well (not shown).

Alternatively, as shown in FIG. 7, the middle fin may be removed to provide a wider STI region or zone separating the implanted regions. In this case, the separation between the n+ and p+ doped regions is achieved by masking. Such a final structure may comprise "(n+ region 410)/(n+ fin 430)/(n+ region 410)/(undoped substrate or well under STI or isolating region 460)/(p+ region 420)/(p+ fin 440)/(p+ region 420)" where "undoped" means significantly less doping, typically at least 100× less, than the n+ or p+ doped regions or fins.

It will readily be understood that, although the present disclosure has been described with reference to an ESD device formed on a p-type substrate, the substrate may have any suitable doping in accordance with the particular application. Similarly, although the use of an n-well is described above, a p-well may also be used, any combination of substrate doping type with well doping type is possible, etc.

Although the present disclosure has been described with reference to a specific implementation, it will readily be appreciated that the present disclosure can be applied to other implementations where heat generated by an ESD event can have a detrimental effect on an ESD protection device.

What is claimed is:

1. A bulk fin-based electrostatic discharge device comprising:
   a semiconductor substrate;
   an isolating layer over the semiconductor substrate;
   a first recess formed in the isolating layer, the first recess comprising a first portion of the isolating layer in a first region and a second portion of the isolating layer in a second region; and
   a first fin protruding from the semiconductor substrate through the first recess formed in the isolating layer within the first and second regions,
   wherein one part of the first fin and an upper substrate portion in the first region are homogeneously doped with a first dopant, and another part of the first fin and an upper substrate portion in the second region are homogeneously doped with a second dopant.

2. The device according to claim 1, wherein the substrate further comprises a well, the upper substrate portions in the first and second regions being located in an upper part of the well.

3. The device according to claim 2, wherein the well and the semiconductor substrate are differently doped.

4. The device according to claim 1, wherein the upper substrate portions of the first and second regions extend horizontally under the isolating layer to form a planar-like region thereunder.

5. The device according to claim 4, wherein the planar-like region extends under the first fin.

6. The device according to claim 1, wherein the first dopant is of opposite type to the second dopant.

7. The device according to claim 1, wherein the first dopant is of a similar type to the second dopant.

8. The device according to claim 1, further comprising at least one gate electrode formed over the first fin, the gate electrode separating the first region and the second region.

9. The device according to claim 8, wherein the first dopant is of a similar type to the second dopant, and wherein the gate electrode comprises a grounded gate electrode.

10. The device according to claim 9, wherein the grounded gate electrode comprises an NMOS grounded gate electrode.

11. The device according to claim 9, wherein the grounded gate electrode comprises a PMOS grounded gate electrode.

12. The device according to claim 1, wherein the first dopant is of substantially the same type as the second dopant and both parts of the first fin are homogeneously doped with substantially the same dopant, the device further comprising a second recess in the isolating layer, and a second fin protruding from the semiconductor substrate through the second recess, upper substrate portions of the second recess and the second fin being oppositely doped relative to the first fin and the upper substrate portions in the first recess.

13. The device according to claim 12, further comprising a third region separating the first and second recesses, the third region being substantially undoped.

14. The device according to claim 13, further comprising a third fin protruding from the semiconductor substrate through the isolating layer in the third region, the third fin being substantially undoped and separating the first recess and the first fin from the second recess and the second fin.

15. The device according to claim 12, wherein the first fin and the second fin are connected to form a diode.

16. The device according to claim 1, wherein the first portion of the isolating layer and the second portion of the isolating layer are regions of the isolation layer with reduced thicknesses relative to a region between the first region and the second region.

* * * * *